(12) United States Patent
Onizuka

(10) Patent No.: US 9,438,175 B2
(45) Date of Patent: Sep. 6, 2016

(54) CASCODE AMPLIFIER

(71) Applicant: KABUSHIKI KAISHA TOSHIBA, Minato-ku (JP)

(72) Inventor: Kohei Onizuka, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 65 days.

(21) Appl. No.: 14/487,465

(22) Filed: Sep. 16, 2014

(65) Prior Publication Data

US 2015/0084695 A1 Mar. 26, 2015

(30) Foreign Application Priority Data

Sep. 20, 2013 (JP) ................................. 2013-195953

(51) Int. Cl.
| | | |
|---|---|---|
| *H03F 3/04* | (2006.01) | |
| *H03F 1/22* | (2006.01) | |
| *H03F 1/30* | (2006.01) | |
| *H03F 1/32* | (2006.01) | |

(52) U.S. Cl.
CPC .............. *H03F 1/223* (2013.01); *H03F 1/301* (2013.01); *H03F 1/3205* (2013.01); *H03F 2200/18* (2013.01); *H03F 2200/456* (2013.01)

(58) Field of Classification Search
CPC .............................................. H03F 2003/4504
USPC ......................................... 330/310, 311, 285
See application file for complete search history.

(56) References Cited

U.S. PATENT DOCUMENTS

| | | |
|---|---|---|
| 7,397,309 B2 | 7/2008 | Tanoi |
| 2014/0043102 A1* | 2/2014 | Su .......................... H03F 3/193 330/295 |

FOREIGN PATENT DOCUMENTS

JP 2006-270466 10/2006

* cited by examiner

*Primary Examiner* — Khanh V Nguyen
*Assistant Examiner* — Khiem Nguyen
(74) *Attorney, Agent, or Firm* — Oblon, McClelland, Maier & Neustadt, L.L.P.

(57) ABSTRACT

In one embodiment, a cascode amplifier includes an amplifier circuit, a replica circuit, a bias circuit, and a feedback circuit. The amplifier circuit includes a first transistor and a second transistor. The second transistor is cascode-connected to the first transistor. The replica circuit includes a third transistor and a fourth transistor. The third transistor has a control terminal connected to a control terminal of the first transistor. The fourth transistor is cascode-connected to the third transistor. The bias circuit applies a bias voltage to a control terminal of the second transistor and a control terminal of the fourth transistor. The feedback circuit performs a feedback control of a voltage of the control terminal of the third transistor. The feedback circuit reduces the difference between a reference current and a current at a predetermined point of the replica circuit.

16 Claims, 6 Drawing Sheets

CASCODE AMPLIFIER

CROSS REFERENCE TO RELATED APPLICATION(S)

This application is based upon and claims the benefit of priority from the prior Japanese Patent Application No. 2013-195953, filed on Sep. 20, 2013, the entire contents of which are incorporated herein by reference.

FIELD

Embodiments described herein relate generally to a cascade amplifier.

BACKGROUND

Cascode amplifiers that each include an amplifier circuit including two transistors cascode-connected to each other, and a bias circuit applying a bias voltage to the two transistors included in the amplifier circuit have conventionally been used. The amplifier circuit includes the transistor (a common-source device) grounded with a source terminal, and the transistor (a common-gate device) cascode-connected to the common-source device. The bias circuit generates the bias voltage to be applied to the common-source device from a reference current source and the diode-connected transistor. The bias circuit also generates the bias voltage to be applied to the common-gate device by applying the same overdrive voltage as in the amplifier body to a replica circuit that includes two transistors cascode-connected to each other. The configuration described above generates, in the amplifier circuit, a bias current that has a magnitude of the reference current multiplied by the channel width/channel length ratio of the common-source device and the common-gate device.

Under a bias condition appropriate to a linear power amplification, the cascode amplifier described above increases the difference between a gate-source voltage Vgs that is the voltage between the gate terminal and source terminal of the common-source device in the amplifier circuit, and a drain-source voltage Vds that is the voltage between the drain terminal and the source terminal. On the other hand, the gate-source voltage Vgs is equal to the drain-source voltage Vds in the transistor applying the bias voltage to the amplifier circuit because of the diode connection. As described above, it is difficult to set an operating point with a high degree of accuracy according to the reference current and the channel width/channel length ratio because the operating conditions of the amplifier circuit and the bias circuit widely vary in a conventional cascode amplifier. Such deterioration in the accuracy is more pronouncedly caused by the production tolerance of each device and the variation in the power-supply voltage.

DETAILED DESCRIPTION

Embodiments will now be explained with reference to the accompanying drawings. The present invention is not limited to the embodiments.

In one embodiment, a cascode amplifier includes an amplifier circuit, a replica circuit, a bias circuit, and a feedback circuit. The amplifier circuit includes a first transistor and a second transistor. The second transistor is cascode-connected to the first transistor. The replica circuit includes a third transistor and a fourth transistor. The third transistor has a control terminal connected to a control terminal of the first transistor. The fourth transistor is cascode-connected to the third transistor. The bias circuit applies a bias voltage to a control terminal of the second transistor and a control terminal of the fourth transistor. The feedback circuit performs a feedback control of a voltage of the control terminal of the third transistor. The feedback circuit reduces the difference between a reference current and a current at a predetermined point of the replica circuit.

First Embodiment

Figure 1:
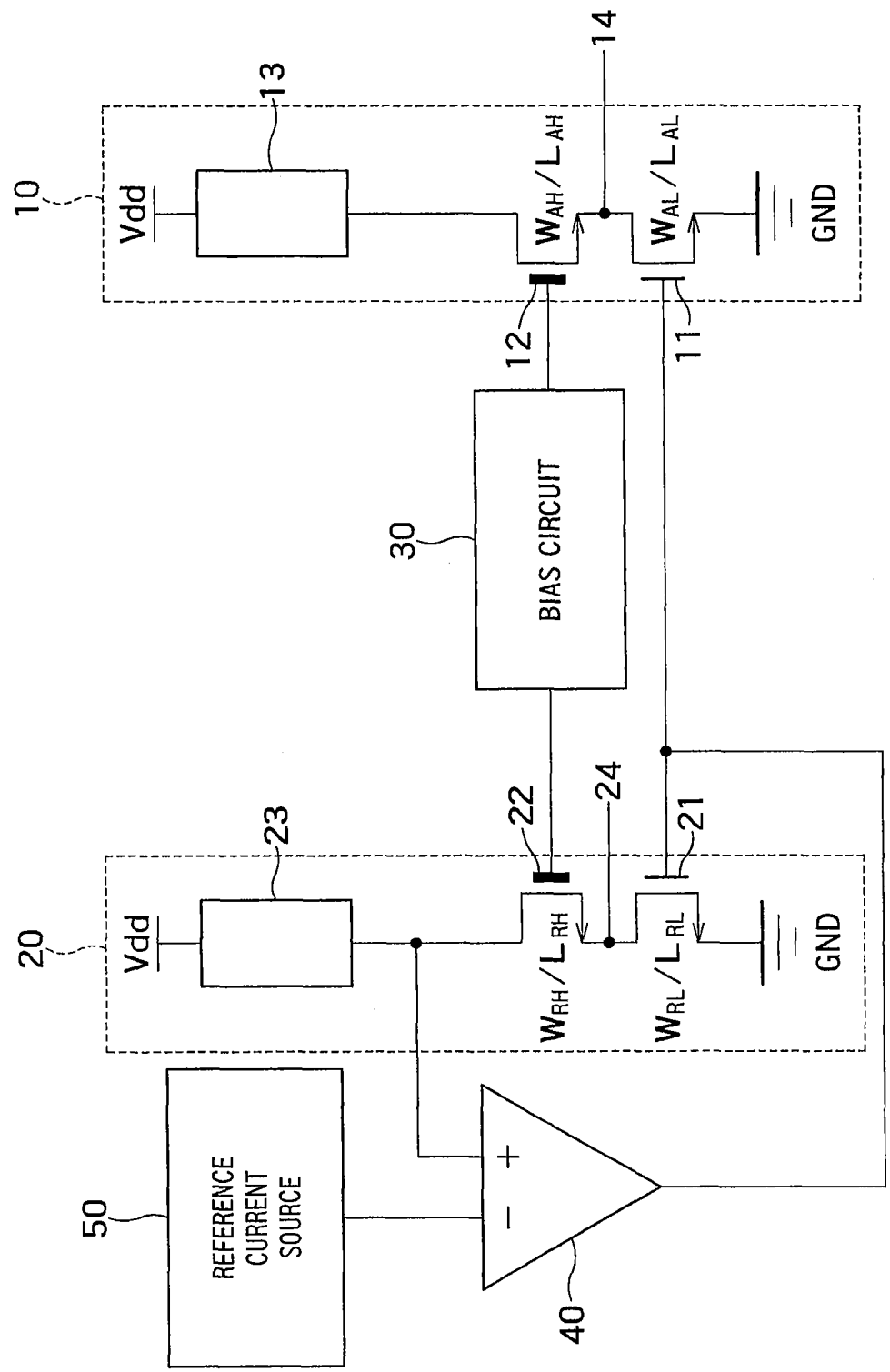
FIG. 1 is a circuit diagram of a first embodiment of the cascode amplifier.

The cascode amplifier according to the first embodiment of the present invention will be described hereinafter with reference to FIG. 1. FIG. 1 is a circuit diagram of the first embodiment of the cascode amplifier. As illustrated in FIG. 1, the cascode amplifier according to the present embodiment includes an amplifier circuit 10, a replica circuit 20 that applies a bias voltage to a first transistor 11 of the amplifier circuit 10, a bias circuit 30 that applies a bias voltage to a second transistor 12 of the amplifier circuit 10, and a feedback circuit 40.

The amplifier circuit 10 includes a first transistor 11 of which source terminal is grounded with, and a second transistor 12 cascode-connected to the first transistor 11.

The first transistor 11 is an N-channel metal-oxide-semiconductor field effect transistor (MOSFET) (hereinafter, referred to as an "NMOS"), and is a common-source device in the amplifier circuit 10. The first transistor 11 can have a low withstand voltage. The first transistor 11 includes a source terminal that is grounded, a drain terminal (output terminal) that is connected to a source terminal of the second transistor 12, and a gate terminal (control terminal) from which a common-source bias voltage Vcs is applied. The first transistor 11 has a channel width of $W_{AL}$ and a channel length of $L_{AL}$. The channel width/channel length that is the ratio of the channel width to the channel length is $W_{AL}/L_{AL}$.

The second transistor 12 is an NMOS, and the common-gate device of the amplifier circuit 10. The second transistor 12 can have a high withstand voltage. The second transistor 12 includes a source terminal that is connected to the drain terminal of the first transistor 11, and a gate terminal (control terminal) from which a common-gate bias voltage Vcg is applied. The drain terminal of the second transistor 12 is connected to a load 13 such that a power-supply voltage Vdd is applied. A resistor or a constant current source can be used as the load 13. The second transistor 12 has a channel width of $W_{AH}$ and a channel length of $L_{AH}$. The channel width/channel length is $W_{AH}/L_{AH}$.

The replica circuit 20 applies the common-source bias voltage Vcs to the first transistor 11 of the amplifier circuit 10. The replica circuit 20 includes a third transistor 21 of which source terminal is grounded, and a fourth transistor 22 cascode-connected to the third transistor 21.

The third transistor 21 is an NMOS of which threshold voltage Vth is equal to that of the first transistor 11, and is the common-source device of the replica circuit 20. The third transistor 21 can have a low withstand voltage. The third transistor 21 includes a source terminal that is grounded, a drain terminal (output terminal) that is connected to a source terminal of the fourth transistor 22, and a gate terminal (control terminal) that is connected to the gate terminal of the first transistor 11. Thus, the gate terminals of the first transistor 11 and the third transistor 21 have an identical voltage. Accordingly, the gate-source voltage Vgs of the first transistor 11 corresponds to the gate-source voltage Vgs of the third transistor 21. The third transistor 21 has a channel width of $W_{RL}$ and a channel length of $L_{RL}$. The channel width/channel length is $W_{RL}/L_{RL}$.

Note that the first transistor 11 and the third transistor 21 will collectively be referred to as a common-source device hereinafter. In other words, the common-source device means both of the first transistor 11 and the third transistor 21 hereinafter.

The fourth transistor 22 is an NMOS of which threshold voltage Vth is equal to that of the second transistor 12, and is the common-gate device of the replica circuit 20. The fourth transistor 22 can have a high withstand voltage. The fourth transistor 22 includes a source terminal that is connected to the drain terminal of the third transistor 21, and a gate terminal from which a common-gate bias voltage Vcg is applied. The drain terminal of the fourth transistor 22 is connected to a load 23 such that a power-supply voltage Vdd is applied. A resistor or a constant current source can be used as the load 23. The fourth transistor 22 has a channel width of $W_{RH}$ and a channel length of $L_{RH}$. The channel width/channel length is $W_{RH}/L_{RH}$.

Note that the second transistor 12 and the fourth transistor 22 will collectively be referred to as a common-gate device hereinafter. In other words, the common-gate device means both of the second transistor 12 and the fourth transistor 22 hereinafter.

In that case, the amplifier circuit 10 and the replica circuit 20 are configured such that the ratio of the channel width/channel length of the first transistor 11 to the channel width/channel length of the second transistor 12 (the channel width/channel length ratio) is equal to the ratio of the channel width/channel length of the third transistor 21 to the channel width/channel length of the fourth transistor 22 (the channel width/channel length ratio). In other words, the channel width/channel length ratios of the common-source devices are the same as the channel width/channel length ratios of the common-gate devices. Thus, $(W_{AH}/L_{AH})/(W_{AL}/L_{AL})=(W_{RH}/L_{RH})/(W_{RL}/L_{RL})$ holds. If the channel width/channel length ratio $(W_{AL}/L_{AL})/(W_{RL}/L_{RL})$ of the common-source device is A, $W_{AH}/L_{AH}=A\times(W_{RH}/L_{RH})$ and $W_{AL}/L_{AL}=A\times(W_{RL}/L_{RL})$ hold. In the present embodiment, the channel width/channel length ratio A can arbitrarily be set. A bias current that is the channel width/channel length ratio times (A times) larger than the reference current occurs in the amplifier circuit 10.

The bias circuit 30 is connected to the gate terminals of the common-gate devices so as to apply the common-gate bias voltage Vcg. The common-gate bias voltage Vcg is set so as to be larger than the threshold voltage Vth of the common-gate devices, and to saturate the common-gate devices. Thus, the gate-source voltage Vgs of the common-gate device in the amplifier circuit 10 corresponds to the gate-source voltage Vgs of the common-gate device in the replica circuit 20. Thus, the voltage of a node 14 to which the drain terminal of the first transistor 11 and the source terminal of the second transistor 12 are connected corresponds to the voltage of a node 24 to which the drain terminal of the third transistor 21 and the source terminal of the fourth transistor 22. In other words, the drain-source voltage Vds of the first transistor 11 corresponds to the drain-source voltage Vds of the third transistor 21. Note that the bias circuit 30 preferably applies the common-gate bias voltage Vcg using a feedfoward control to prevent a disturbance from varying the bias voltage.

The feedback circuit 40 includes an operational amplifier. The − terminal is connected to the reference current source 50 or its current-to-voltage converted output. The + terminal is connected to the drain terminal of the fourth transistor 22. The output terminal is connected to the gate terminal of the third transistor 21. Thus, the feedback circuit 40 is applied with the reference current from the − terminal and is applied with a current generated in the replica circuit 20 from the + terminal. Then, the feedback circuit 40 compares the magnitudes of the applied currents to perform a feedback control (negative feedback) of the voltage of the gate terminal in the third transistor 21 so as to reduce the difference between the current value in the replica circuit 20 and the current value of the reference current, or so as to equalize the current value in the replica circuit 20 and the current value of the reference current. This causes a current having the same magnitude as the reference current to flow in the replica circuit 20, and generates the common-source bias voltage Vcs to be applied to the gate terminals of the common-source devices (the first transistor 11 and the third transistor 21).

The configuration described above causes the cascode amplifier according to the present embodiment to equalize the gate-source voltages Vgs and drain-source voltages Vds of the common-source devices and equalize the gate-source voltages Vgs of the common-gate devices, regardless of the variation in the power-supply voltage Vdd or the variation in the threshold voltage Vth in each of the transistors. The feedback of the reference current to the common-source device can set an accurate value appropriate to the reference current as the common-source bias voltage Vcs to be applied to the common-source device. This can set the operating point of the amplifier circuit 10 with a high degree of accuracy. This can also reduce the influence of the PVT variations relative to the maximum output power and linearity of the amplifier 10, and can obtain a stable small signal gain as well.

Second Embodiment

A cascode amplifier according to the second embodiment of the present invention will be described hereinafter. Note that the description of the same configuration as the first embodiment will be omitted in the following description of each embodiment and thus only the different configuration from the first embodiment will be described.

Figure 2:
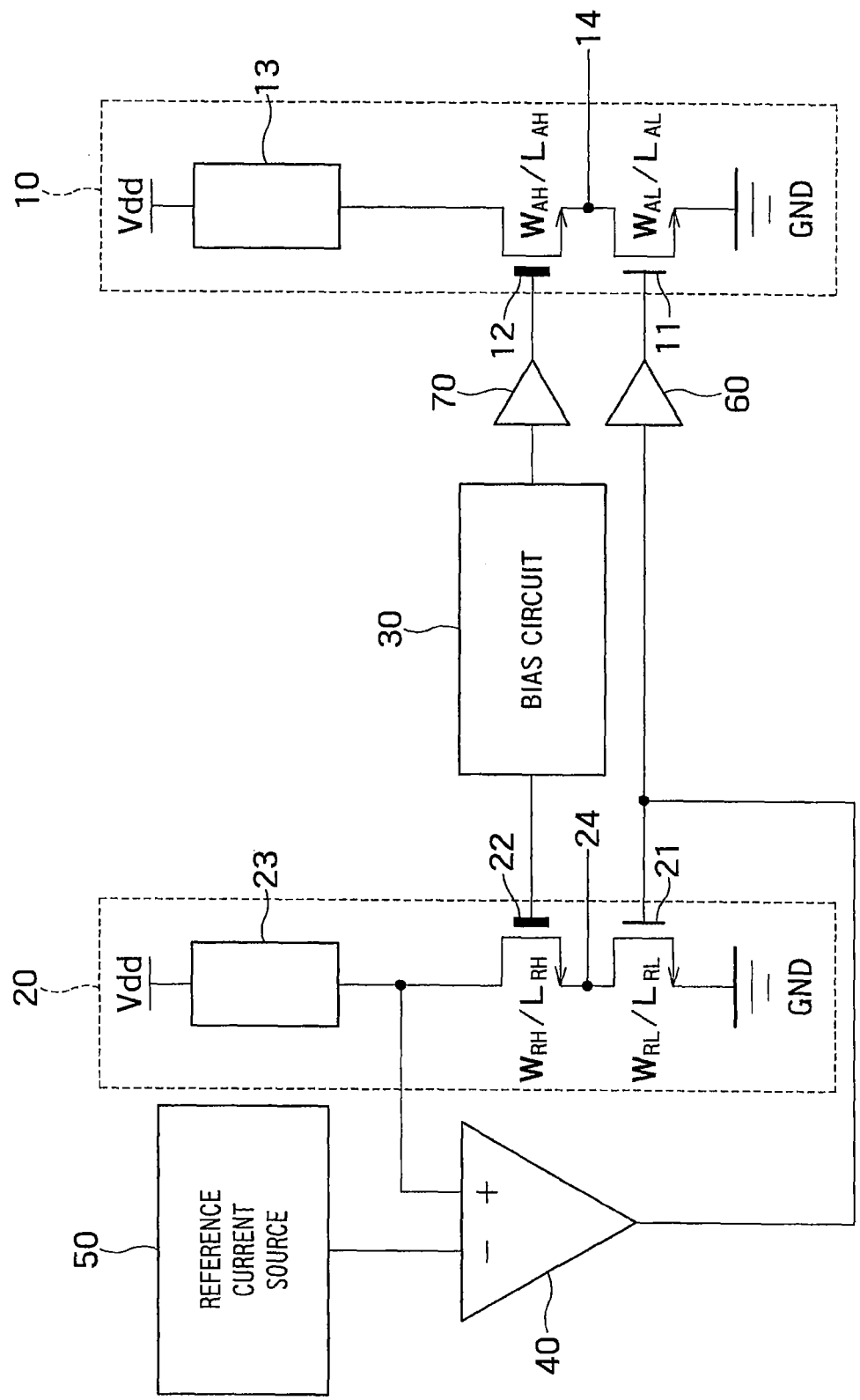
FIG. 2 is a circuit diagram of a second embodiment of the cascode amplifier.

FIG. 2 is a circuit diagram of the second embodiment of the cascode amplifier. As illustrated in FIG. 2, the cascode amplifier according to the present embodiment includes a first buffer circuit 60 provided between a gate terminal of a first transistor 11 and a gate terminal of a third transistor 21, and a second buffer circuit 70 provided between a gate terminal of a second transistor 12 and a bias circuit 30.

The first buffer circuit 60 is applied with a common-source bias voltage Vcs from the third transistor 21 of a replica circuit 20 and applies the same voltage as the common-source bias voltage Vcs to the first transistor 11 in the amplifier circuit 10. The buffer circuit 60 is configured to suppress the influence of the variation in the voltage or current on the output side (the first transistor 11 side) to the input side (the third transistor 21 side). For example, an amplifier having a gain of one can be used as the first buffer circuit 60.

The second buffer circuit 70 is applied with a common-gate bias voltage Vcg from the bias circuit 30 and applies the same voltage as the common-gate bias voltage Vcg to the second transistor 12 of the amplifier circuit 10. The second buffer circuit 70 is configured to suppress the influence of the variation in the voltage or current on the output side (the second transistor 12 side) to the input side (the bias circuit 30 side). For example, an amplifier having a voltage gain of one can be used as the second buffer circuit 70.

The configuration described above causes the cascode amplifier according to the second embodiment to increase the isolation of a signal pathway from the output side to the generating side of the bias voltage, and can reduce the influence of the operation of the amplifier 10 to the circuit that outputs the bias voltage. For example, when a large signal is input to the amplifier circuit 10, the impedance is reduced at a point at which the bias voltage is applied to the amplifier circuit 10 and the amplified signal generated in the amplifier circuit 10 is input to the output side of the bias voltage through the parasitic capacitance of the amplifier circuit 10. This deteriorates the accuracy of the output voltage of the bias voltage and sometimes deforms the amplified signal generated in the amplifier circuit 10. The present embodiment can reduce such an influence by providing the buffer circuits 60 and 70 between the output side and input side of the bias voltage. Accordingly, regardless of the output level of the amplifier 10, a stable bias voltage can be applied to the amplifier 10.

Third Embodiment

Figure 3:
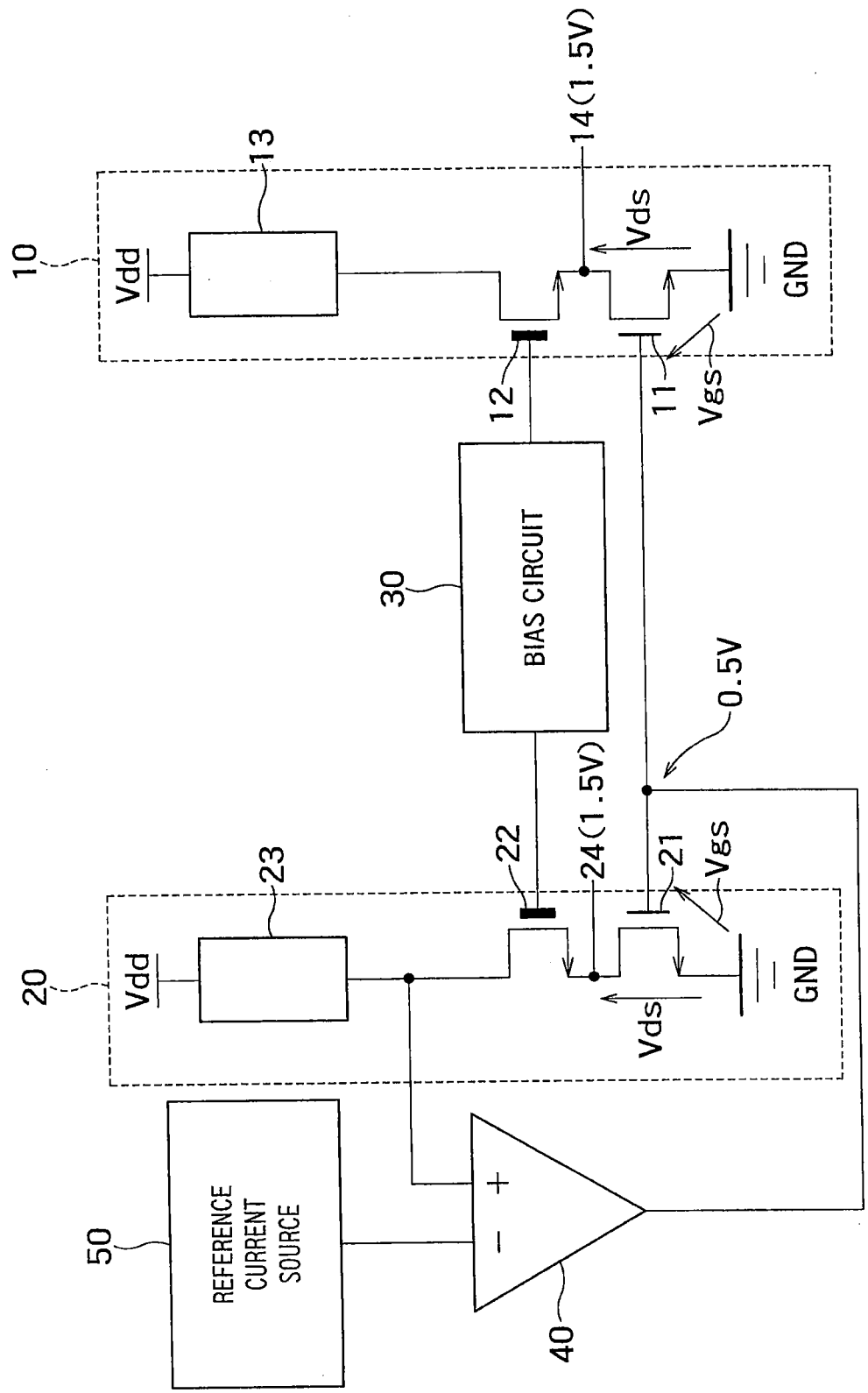
FIG. 3 is a circuit diagram of a third embodiment of the cascode amplifier.

A cascode amplifier according to the third embodiment of the present invention will be described hereinafter. FIG. 3 is a circuit diagram of the third embodiment of the cascode amplifier. As illustrated in FIG. 3, in the cascode amplifier according to the present embodiment, the drain-source voltages Vds of common-source devices are set higher than the gate-source voltages Vgs.

The gate-source voltages Vgs of each of the common-source devices preferably has a value slightly larger than a threshold voltage Vth (for example, 0.5 V) such that each transistor is saturated. This improves the power efficiency at the back off time or the linearity of the operation of the amplifier circuit 10.

The drain-source voltages Vds of the common-source devices are preferably set at a high voltage (for example, 1.5 V). This can increase the output current (the drain-source current) of the amplifier circuit 10.

Fourth Embodiment

Figure 4:
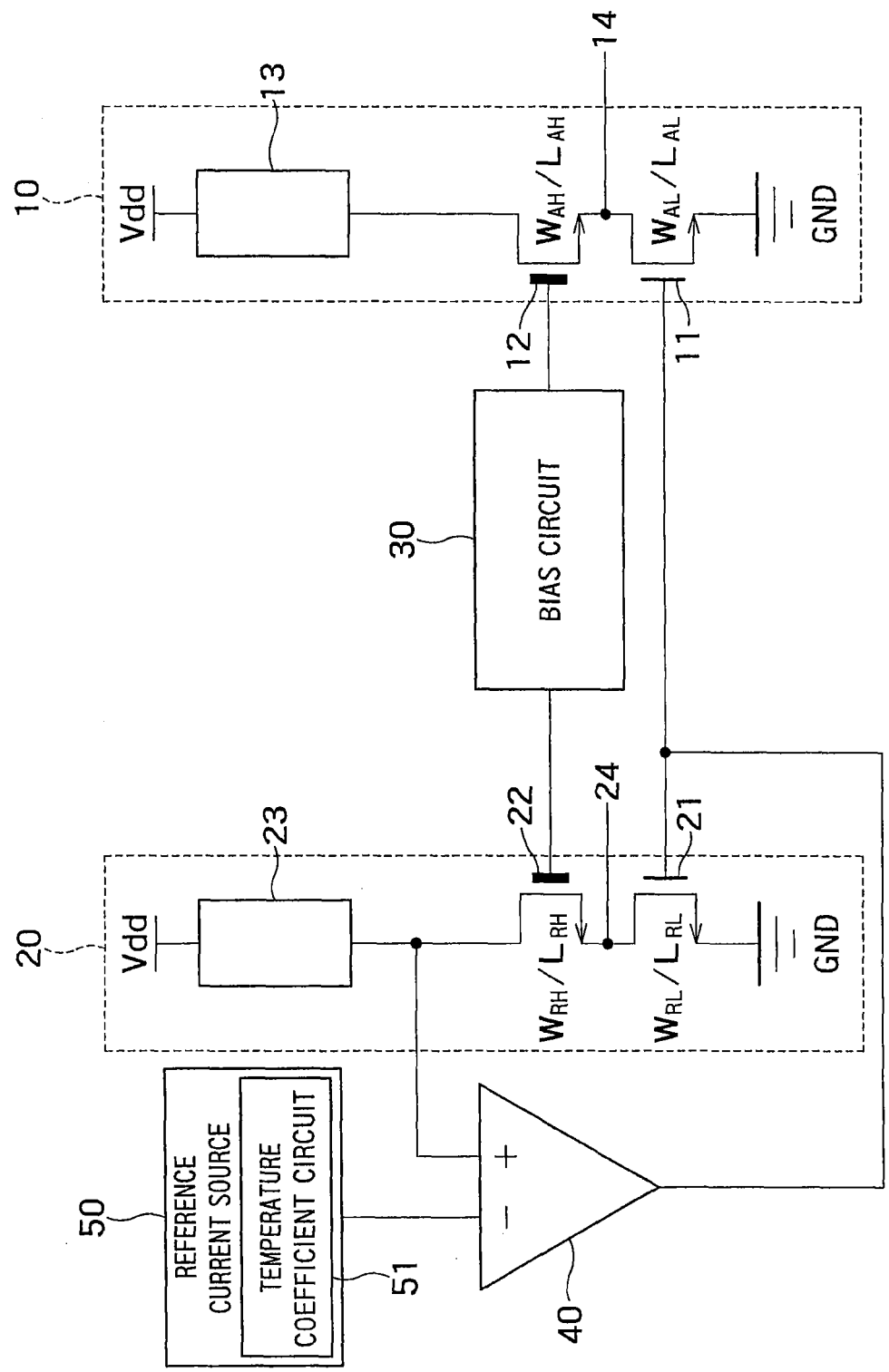
FIG. 4 is a circuit diagram of a fourth embodiment of the cascode amplifier.

A cascode amplifier according to the fourth embodiment of the present invention will be described hereinafter. FIG. 4 is a circuit diagram of the fourth embodiment of the cascode amplifier. As illustrated in FIG. 4, a reference current source 50 includes a temperature coefficient circuit 51 having a temperature coefficient in the present embodiment. The temperature coefficient circuit 51 regulates the magnitude of a reference current based on the temperature at least one of an amplifier circuit 10 and a replica circuit 20. For example, the temperature coefficient can be a coefficient indicating the amount or rate of the reference current to be increased or reduced base on the difference between the reference temperature and the temperature of the circuit. Alternatively, the temperature coefficient can be a coefficient indicating the amount or rate of the reference current to be increased or reduced according to the temperature of the circuit without the reference temperature. For example, if it is necessary to increase the reference current at a high temperature, the temperature coefficient of a high temperature included in the temperature coefficient circuit 51 can be set as the positive. Note that, for example, the temperature of each device included in the circuit, the temperature of the wiring portion, or the temperature of the air around the circuit can be used as the circuit temperature described above. The temperature coefficient circuit 51 can obtain the temperature of the circuit from an arbitrary temperature measuring unit. The configuration described above regulates the bias current in the amplifier circuit 10 that varies depending on the temperature, and can obtain a preferable amplification characteristic in a plurality of temperature conditions.

Fifth Embodiment

Figure 5:
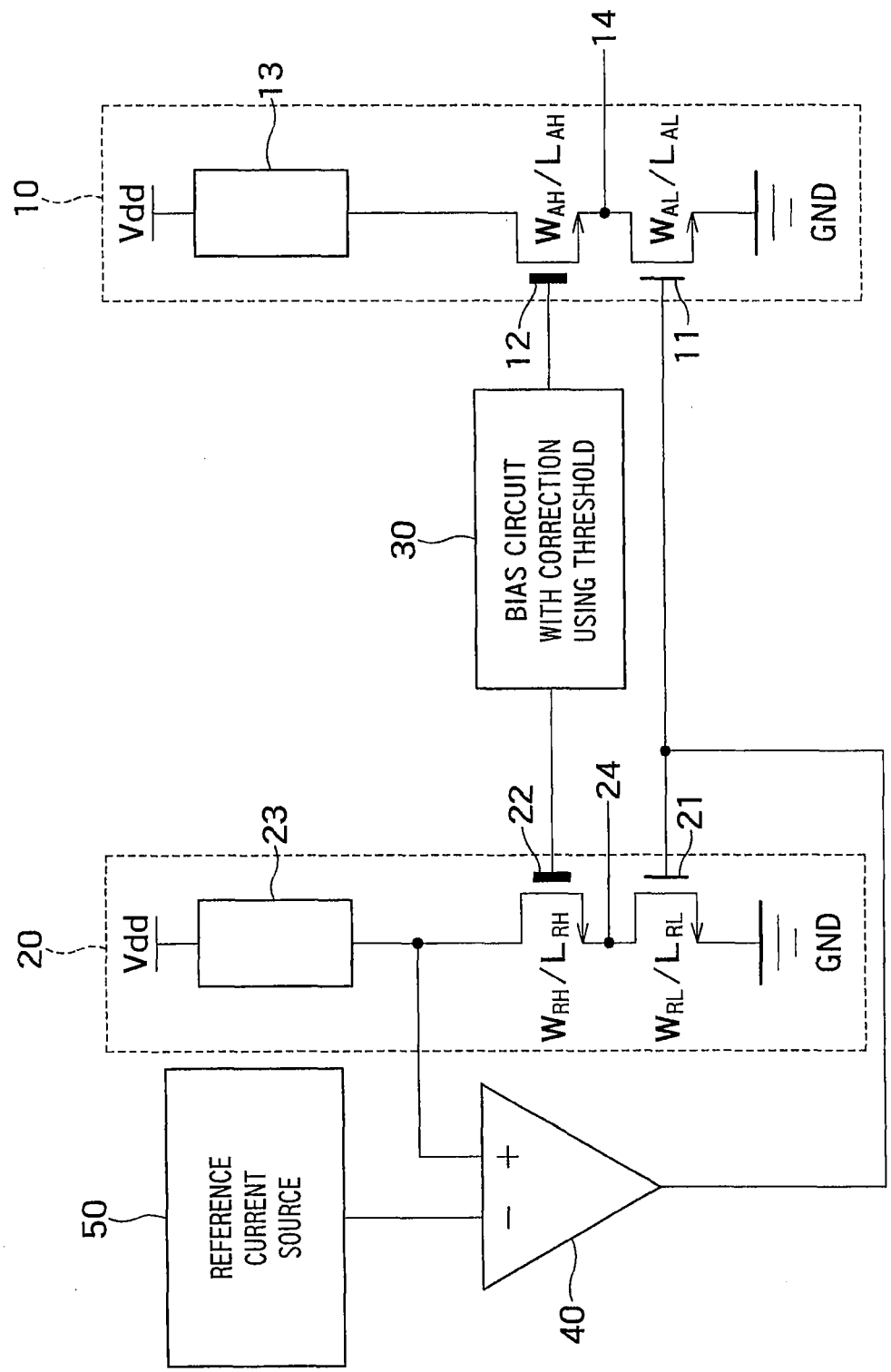
FIG. 5 is a circuit diagram of a fifth embodiment of the cascode amplifier.

A cascode amplifier according to the fifth embodiment of the present invention will be described hereinafter. FIG. 5 is a circuit diagram of the fifth embodiment of the cascode amplifier. As illustrated in FIG. 5, a bias circuit 30 regulates a common-gate bias voltage Vcg based on a threshold voltage Vth of a common-gate device in the present embodiment. For example, the bias circuit 30 can regulate the common-gate bias voltage Vcg such that Vcg=Vth+Vmid holds. At that time, the voltages of nodes 14 and 24 hardly depend on the Vth and are determined depending on the Vmid. The configuration described above reduces the dependency of the drain-source voltage Vds of the common-source device on the threshold voltage Vth of the common-gate device, and thus can reduce the effect of the variation in the characteristic of each transistor. Accordingly, the voltages of nodes 14 and 24 can appropriately be set regardless of the variation in the threshold voltage Vth of the common-gate device. Note that setting the Vmid at a high voltage can improve the output power of the amplifier circuit 10. Furthermore, to secure the reliability on the operation of the common-source device, the upper limit can be set on the Vmid.

Sixth Embodiment

Figure 6:
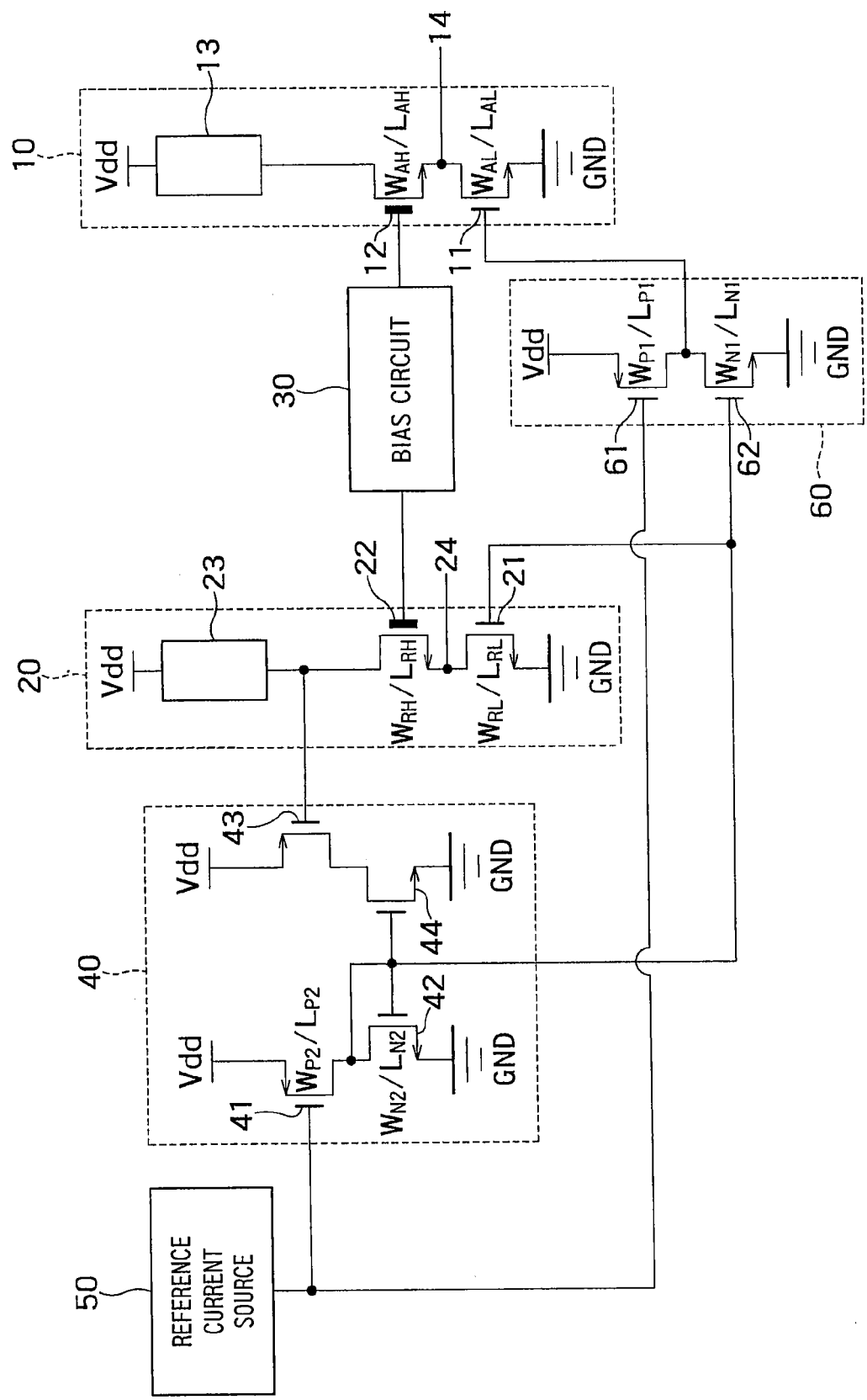
FIG. 6 is a circuit diagram of a sixth embodiment of the cascode amplifier.

A cascode amplifier according to the sixth embodiment of the present invention will be described hereinafter. FIG. 6 is a circuit diagram of the sixth embodiment of the cascode amplifier. As illustrated in FIG. 6, the cascode amplifier of the present embodiment includes a first buffer circuit 60. The first buffer circuit 60 includes a fifth transistor 61 having a gate terminal from which a voltage according to the reference current is applied, and a sixth transistor 62 having a drain terminal that is connected to the drain terminal of the transistor 61, and a gate terminal from which a common-source bias voltage Vcs is applied.

The fifth transistor 61 is a P-channel MOSFET (hereinafter, referred to as a "PMOS"). The fifth transistor 61 includes a source terminal from which a power-supply voltage Vdd is applied, a drain terminal that is connected to the drain terminal of the sixth transistor 62, and a gate terminal that is connected to a reference current source 50 so as to be applied with a voltage according to the reference current. The fifth transistor 61 has a channel width of $W_{P1}$ and a channel length of $L_{P1}$. The channel width/channel length is $W_{P1}/L_{P1}$.

A sixth transistor 62 is an NMOS. The sixth transistor 62 includes a source terminal that is grounded, a drain terminal that is connected to the drain terminal of a fifth transistor, and a gate terminal from which a common-source bias voltage Vcs is applied. The sixth transistor 62 has a channel width of $W_{P2}$ and a channel length of $L_{P2}$. The channel width/channel length is $W_{P2}/L_{P2}$.

A feedback circuit 40 of the present embodiment includes a seventh transistor 41 having a gate terminal from which a reference current is applied, and an eighth transistor 42 having a drain terminal that is connected to the drain terminal of the seventh transistor 41 and a drain terminal from which a feedback is given to the gate terminal of the third transistor 21.

The seventh transistor 41 is a PMOS. The seventh transistor 41 includes a source terminal from which a power-supply voltage Vdd is applied, a drain terminal that is connected to the drain terminal of the eighth transistor 42, and a gate terminal that is connected to the reference current source 50 so as to be applied with the reference current. The seventh transistor 41 has a channel width of $W_{P2}$ and a channel length of $L_{P2}$. The channel width/channel length is $W_{P2}/L_{P2}$.

The seventh transistor 41, together with a ninth transistor 43, forms a differential circuit in a feedback circuit 40. The ninth transistor 43 is a PMOS. The ninth transistor 43 includes a source terminal from which a power-supply voltage Vdd, a drain terminal that is connected to the drain terminal of the tenth transistor 44, and a gate terminal that is connected to the replica circuit 20 so as to be applied with a current generated in the replica circuit 20.

The eighth transistor 42 is an NMOS. The eighth transistor 42 includes a source terminal that is grounded, a drain terminal that is connected to the drain terminal of the seventh transistor 41, and a gate terminal from which a feedback of the output voltage is given to the gate terminal of the third transistor 21 in order to generate a common-source bias voltage Vcs. The eighth transistor 42 has a channel width of $W_{N2}$ and a channel length of $L_{N2}$. The channel width/channel length is $W_{N2}/L_{N2}$.

The eighth transistor 42 includes a gate terminal and a drain terminal diode-connected to each other and the gate terminal is connected to the gate terminal of the tenth transistor 44. This forms a current mirror circuit in the feedback circuit 40. The tenth transistor 44 is an NMOS. The tenth transistor 44 includes a source terminal that is grounded, a drain terminal that is connected to the drain terminal of the ninth transistor 43, and a gate terminal from which a feedback of the output voltage is given to the gate terminal of the third transistor 21 in order to generate a common-source bias voltage Vcs.

In that case, the buffer circuit 60 and the feedback circuit 40 are configured such that the ratio of the channel width/channel length of the fifth transistor 61 to the channel width/channel length of the sixth transistor 62 is equal to the ratio of the channel width/channel length of the seventh transistor 41 to the channel width/channel length of the eighth transistor 42. In other words, $(W_{P1}/L_{P1})/(W_{N1}/L_{N1}) = (W_{P2}/L_{P2})/(W_{N2}/L_{N2})$ holds. If the channel width/channel length ratio $(W_{P1}/L_{P1})/(W_{P2}/L_{P2})$ between the fifth transistor 61 and the seventh transistor 41 is B, $W_{P1}/L_{P1} = B \times (W_{P2}/L_{P2})$ and $W_{N1}/L_{N1} = B \times (W_{N2}/L_{N2})$ hold. The channel width/channel length ratio B is set at one in the present embodiment. This applies a common-source bias voltage Vcs to the amplifier circuit 10 with a high degree of accuracy.

The configuration described above can buffer the common-source bias voltage Vcs applied from the feedback circuit 40 with a high degree of accuracy and apply the voltage Vcs to the amplifier circuit 10 while the number of the devices is reduced even though the transistors in the buffer circuit 60 and the feedback circuit 40 have the variations in the device characteristics because of the production tolerance among the wafers.

All of the common-source devices and the common-gate devices in the embodiments of the present invention are NMOSs. However, they can be PMOSs. In such a case, all of the common-source devices and the common-gate devices are PMOSs and the connection of the drain terminal and the source terminal in each device is reversed from the description above.

When the gain is one, the cascode amplifier according to the present embodiment can be used as a current mirror that replicates the reference current with a high degree of accuracy. In such a case, the channel width/channel length ratio A of the common-source device and the common-gate device can be set at one.

Furthermore, the cascode amplifier can include a reference voltage source that applies a predetermined reference voltage instead of the reference current source 50. In such a case, applying the reference voltage generates a current in the replica circuit 20. The current is amplified in the amplifier circuit 10 and becomes a bias current to set the operating point of the amplifier circuit 10.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A cascode amplifier comprising:
   an amplifier circuit including a first transistor and a second transistor cascode-connected to the first transistor;
   a replica circuit including a third transistor having a control terminal connected to a control terminal of the first transistor, and a fourth transistor cascode-connected to the third transistor;
   a bias circuit applying a bias voltage to a control terminal of the second transistor and a control terminal of the fourth transistor; and
   a feedback circuit performing a feedback control of a voltage of the control terminal of the third transistor to reduce the difference between a reference current and a current at a predetermined point of the replica circuit,
   wherein a ratio of a ratio of a channel width to a channel length of the third transistor to a ratio of a channel width to a channel length of the fourth transistor is equal to a ratio of a ratio of a channel width to a channel length of the first transistor to a ratio of a channel width to a channel length of the second transistor.

2. The cascode amplifier according to claim 1, further comprising:

a buffer circuit provided at least between the control terminal of the first transistor and the control terminal of the third transistor or between the control terminal of the second transistor and the bias circuit.

3. The cascode amplifier according to claim 1, wherein voltages of output terminals of the first transistor and the third transistor are higher than voltages of the control terminals of the first transistor and the third transistor.

4. The cascode amplifier according to claim 1, further comprising: a temperature coefficient circuit generating the reference current according to at least one of the temperatures of the amplifier circuit and the replica circuit.

5. The cascode amplifier according to claim 1, wherein the bias circuit applies a bias voltage based on a threshold voltage of the second transistor and the fourth transistor to the control terminal of the second transistor and the control terminal of the fourth transistor.

6. The cascode amplifier according to claim 1, further comprising:
a buffer circuit provided between the control terminal of the first second transistor and the bias circuit,
wherein the buffer circuit includes a fifth transistor having a control terminal applied the reference current, and
a sixth transistor connected to the fifth transistor, the sixth transistor having a control terminal applied the bias voltage, and
the feedback circuit includes a seventh transistor having a control terminal applied the reference current, and
an eighth transistor connected to the seventh transistor, the eighth transistor having a control terminal performing the feedback control to the control terminal of the third transistor.

7. The cascode amplifier according to claim 6, wherein a ratio of a ratio of a channel width to a channel length of the fifth transistor to a ratio of a channel width to a channel length of the sixth transistor is equal to a ratio of a ratio of a channel width to a channel length of the seventh transistor to a ratio of a channel width to a channel length of the eighth transistor.

8. The cascode amplifier according to claim 1, wherein the first transistor, the second transistor, the third transistor, and the fourth transistor are MOS transistors.

9. A cascode amplifier comprising:
an amplifier circuit including a first transistor and a second transistor cascode-connected to the first transistor;
a replica circuit including a third transistor having a control terminal connected to a control terminal of the first transistor, and a fourth transistor cascode-connected to the third transistor;
a bias circuit applying a bias voltage to a control terminal of the second transistor and a control terminal of the fourth transistor; and
a feedback circuit performing a feedback control of a voltage of the control terminal of the third transistor to reduce the difference between a reference voltage and a voltage at a predetermined point of the replica circuit,
wherein a ratio of a ratio of a channel width to a channel length of the third transistor to a ratio of a channel width to a channel length of the fourth transistor is equal to a ratio of a ratio of a channel width to a channel length of the first transistor to a ratio of a channel width to a channel length of the second transistor.

10. The cascode amplifier according to claim 9, further comprising:
a buffer circuit provided at least between the control terminal of the first transistor and the control terminal of the third transistor or between the control terminal of the second transistor and the bias circuit.

11. The cascode amplifier according to claim 9, wherein voltages of output terminals of the first transistor and the third transistor are higher than voltages of the control terminals of the first transistor and the third transistor.

12. The cascode amplifier according to claim 9, further comprising: a temperature coefficient circuit generating the reference voltage according to at least one of the temperatures of the amplifier circuit and the replica circuit.

13. The cascode amplifier according to claim 9, wherein the bias circuit applies a bias voltage based on a threshold voltage of the second transistor and the fourth transistor to the control terminal of the second transistor and the control terminal of the fourth transistor.

14. The cascode amplifier according to claim 9, further comprising:
a buffer circuit provided between the control terminal of the first second transistor and the bias circuit,
wherein the buffer circuit includes a fifth transistor having a control terminal applied the reference voltage, and
a sixth transistor connected to the fifth transistor, the sixth transistor having a control terminal applied the bias voltage, and
the feedback circuit includes a seventh transistor having a control terminal applied the reference voltage, and
an eighth transistor connected to the seventh transistor, the eighth transistor having a control terminal performing the feedback control to the control terminal of the third transistor.

15. The cascode amplifier according to claim 14, wherein a ratio of a ratio of a channel width to a channel length of the fifth transistor to a ratio of a channel width to a channel length of the sixth transistor is equal to a ratio of a ratio of a channel width to a channel length of the seventh transistor to a ratio of a channel width to a channel length of the eighth transistor.

16. The cascode amplifier according to claim 9, wherein the first transistor, the second transistor, the third transistor, and the fourth transistor are MOS transistors.

* * * * *